(12) United States Patent
Berke et al.

(10) Patent No.: US 8,639,918 B2
(45) Date of Patent: Jan. 28, 2014

(54) MEMORY COMPATIBILITY SYSTEM AND METHOD

(75) Inventors: Stuart Allen Berke, Austin, TX (US); William Sauber, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 323 days.

(21) Appl. No.: 13/222,938

(22) Filed: Aug. 31, 2011

(65) Prior Publication Data

US 2013/0054949 A1 Feb. 28, 2013

(51) Int. Cl.
 *G06F 15/177* (2006.01)
 *G06F 3/00* (2006.01)
 *G06F 13/12* (2006.01)

(52) U.S. Cl.
 USPC .......... 713/2; 713/1; 710/11; 710/15; 710/71; 710/74

(58) Field of Classification Search
 USPC ............................ 713/1, 2; 710/11, 15, 71, 74
 See application file for complete search history.

(56) References Cited

U.S. PATENT DOCUMENTS

| | | | |
|---|---|---|---|
| 6,363,450 B1 * | 3/2002 | Lash et al. | 710/301 |
| 7,577,039 B2 * | 8/2009 | Yang et al. | 365/189.05 |
| 8,151,009 B2 * | 4/2012 | Goldstein et al. | 710/11 |
| 8,397,013 B1 * | 3/2013 | Rosenband et al. | 711/103 |
| 2005/0005045 A1 * | 1/2005 | Kim et al. | 710/74 |
| 2009/0020608 A1 * | 1/2009 | Bennett et al. | 235/441 |
| 2010/0042778 A1 * | 2/2010 | Tanguay et al. | 711/105 |
| 2011/0082971 A1 | 4/2011 | Berke | |

OTHER PUBLICATIONS

Stuart Allen Berke; "Memory Buffer for Buffer-On-Board Application;" U.S. Appl. No. 13/086,867, filed Apr. 14, 2011; 51 Pages.

* cited by examiner

*Primary Examiner* — Vincent Tran
(74) *Attorney, Agent, or Firm* — Haynes and Boone, LLP

(57) ABSTRACT

An apparatus including a first connector configured to fit into a first socket in a processing system, the first connector and first socket conforming to a first standard, a second socket configured to accept a memory module therein, the second socket and the memory module conforming to a second standard, a memory buffer module communicatively coupled to the first connector and the second socket, the memory buffer module configured to receive signals associated with the first standard from the first connector and output signals associated with the second standard to the second socket, and a virtualization module communicatively coupled to the memory buffer module, the first connector, and the second socket, the virtualization module configured to receive first initialization data associated with the second standard from the second socket and output second initialization data associated with the first standard to the processing system.

20 Claims, 7 Drawing Sheets

MEMORY COMPATIBILITY SYSTEM AND METHOD

BACKGROUND

The present disclosure relates generally to information handling systems, and more particularly to a memory compatibility system and method.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs may include system memory in the form of Dual In-line Memory Module (DIMM) devices that may conform to a standard promulgated by the Joint Electron Devices Engineering Council (JEDEC, also known as JEDEC Solid State Technology Association). Generally speaking, an IHS designed to accept DIMMs conforming to a current JEDEC standard is not compatible with DIMMs conforming to previous generations. For example, different DIMM standards may call for different physical configurations and different signaling characteristics. Accordingly, although IHSs and DIMMs have been generally satisfactory, they have not been satisfactory in all respects.

SUMMARY

According to one embodiment an apparatus includes a first connector configured to fit into a first socket in a processing system, the first connector and first socket conforming to a first standard, a second socket configured to accept a memory module therein, the second socket and the memory module conforming to a second standard, a memory buffer module communicatively coupled to the first connector and the second socket, the memory buffer module configured to receive signals associated with the first standard from the first connector and output signals associated with the second standard to the second socket, a virtualization module communicatively coupled to the memory buffer module, the first connector, and the second socket, the virtualization module configured to receive first initialization data associated with the second standard from the second socket and output second initialization data associated with the first standard to the processing system, and a power regulation module communicatively coupled to the virtualization module and the second socket, the power regulation module configured to output an amount of power to the second socket based upon the initialization data.

DETAILED DESCRIPTION

It is to be understood that the following disclosure provides many different embodiments, or examples, for implementing different features of the present disclosure. Specific examples of components and arrangements are described below to simplify the present disclosure. These are, of course, merely examples and are not intended to be limiting. Various components may be arbitrarily drawn in different scales for the sake of simplicity and clarity.

In addition, for purposes of this disclosure, an information handing system (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, a mobile communication device, or any other suitable device. The IHS may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
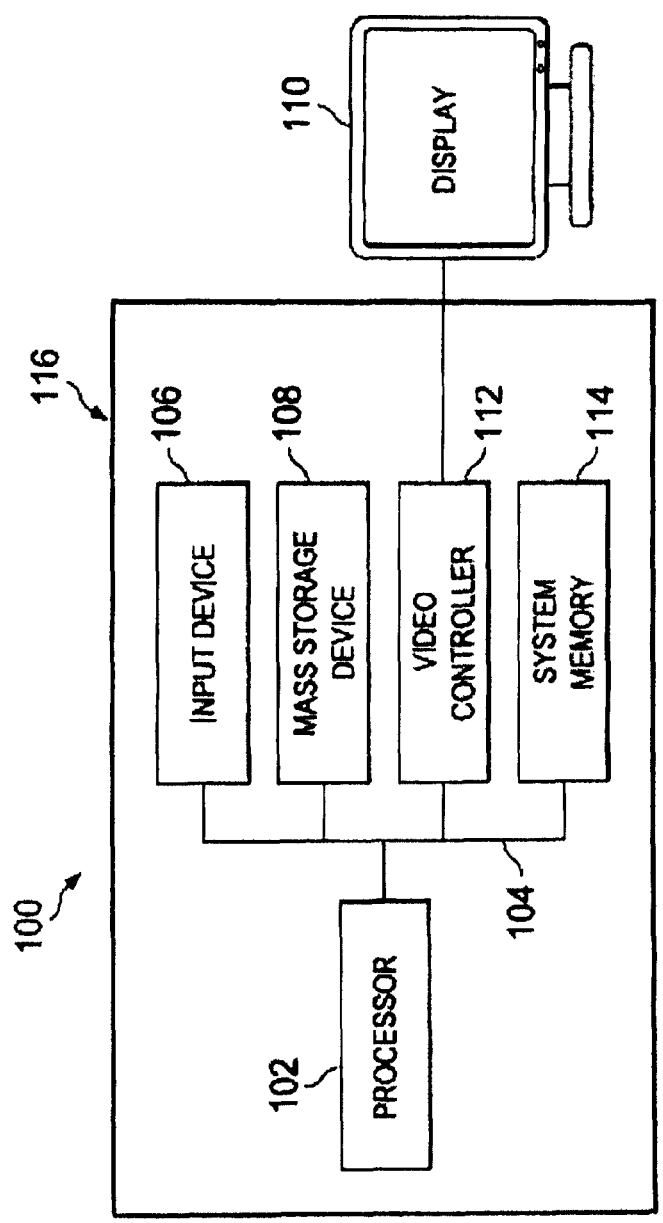
FIG. 1 is a simplified block diagram of an example information handling system (IHS).

In one embodiment, an IHS 100 shown in FIG. 1 includes a processor 102, which is connected to a bus 104. Bus 104 serves as a connection between processor 102 and other components of IHS 100. An input device 106 is coupled to processor 102 to provide input to processor 102. Examples of input devices may include keyboards, touch-screens, pointing devices such as mice, trackballs, and track-pads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
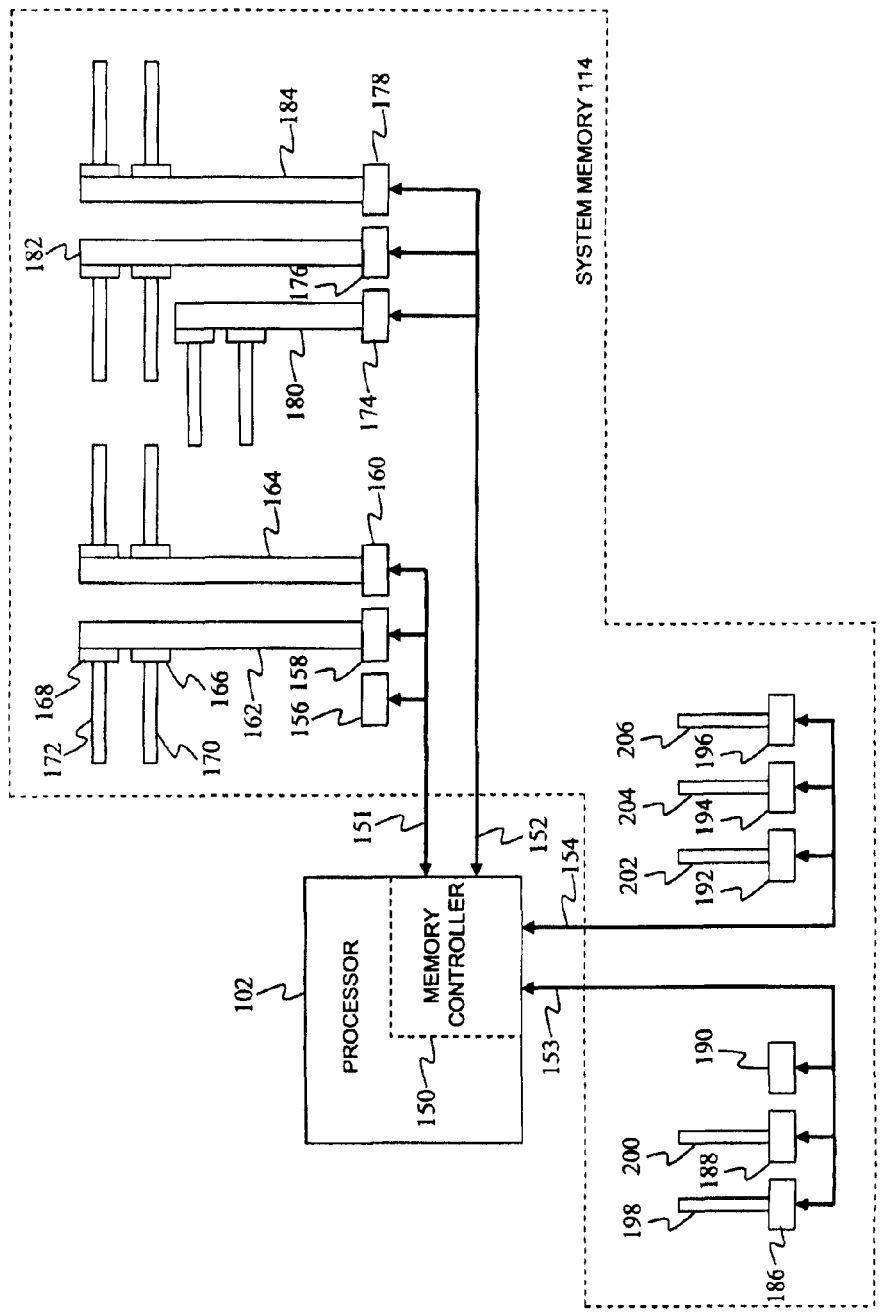
FIG. 2 is a functional block diagram of a portion of the IHS of FIG. 1 including the processor and the system memory.

FIG. 2 is a functional block diagram of a portion of the IHS 100 of FIG. 1 including the processor 102 and the system memory 114. In the illustrated embodiment, the processor 102 includes an integrated memory controller 150 that manages the flow of data to and from the system memory 114. In alternate embodiments, however, the memory controller 150 may be separate from the processor 102. The system memory 114 is generally communicatively coupled to the processor (and memory controller 150) via channels 151, 152, 153, and 154. The channels 151, 152, 153, and 154 carry data and command signals between the memory controller 150 and the system memory 114. The channels may support one, two, three, or more DIMM sockets per channel depending on the needs of the IHS. Further, although four channels are shown, fewer channels or additional channels may be communicatively coupled to the memory controller 150. Generally, one or more sockets accepting memory modules may communicate with the memory controller 150 via the channels. In the illustrated embodiment, Dual In-line Memory Module (DIMM) sockets 156, 158, and 160 are communicatively coupled to the memory controller 150 via the channel 151. The DIMM sockets 156, 158, and 160 conform to the proposed Double Data Rate Four (DDR4) DIMM standards to be promulgated by the Joint Electron Devices Engineering Council (JEDEC). For instance, each DIMM socket 156, 158, and 160 includes 284 electrical contacts that are configured to mate with 284 pins on a DDR4 DIMM. Alternatively, the sockets 156, 158, and 160 may be single in-line memory module (SIMM) sockets or another type of memory module socket and may conform to a different standard such as the DDR3 SDRAM standard, a future DDR standard promulgated by JEDEC, or another memory standard or proprietary design. The JEDEC DDR3 SDRAM standard as specified in the JEDEC document JESD79-3E (July 2010) is incorporated in its entirety by reference herein.

As shown in FIG. 2, a memory riser card 162 is inserted into DIMM socket 158 and a memory riser card 164 is inserted into DIMM socket 160. As will be described in more detail in subsequent sections, connector portions of riser cards 162 and 164 conform to the proposed DDR4 DIMM standards such that they mate with the sockets 158 and 160. The riser card 162 includes DIMM sockets 166 and 168 that conform to the DDR3 DIMM standards. In the illustrated configuration, DDR3 SDRAM DIMMs 170 and 172 are respectively inserted in to the DIMM sockets 166 and 168. The riser card 164 also includes a pair of DDR3-based DIMM sockets that have DDR3 DIMMS inserted therein. In other embodiments, however, the riser card 162 may include DIMM sockets that conform to a different standard such as the proposed DDR4 DIMM standards, the DDR2 DIMM standards, or a future standard promulgated by JEDEC or another standard setting organization. Generally speaking, the riser cards permit an IHS with DIMM sockets conforming to a first standard to utilize DIMMs conforming to a second standard that is incompatible with the first standard. For instance, in the illustrated embodiment, the DIMM socket 158 coupled to the memory controller 150 is a DDR4 socket (i.e. the host IHS natively supports DDR4 DIMMS) and the DIMM sockets 166 and 168 on the riser card 162 are DDR3 sockets. Although DDR3 SDRAM DIMMs are physically incompatible with DDR4-based sockets (284-pin standard vs. 240-pin standard), the riser card 162 permits the DDR4-based IHS to utilize DDR3 DIMMs. One of ordinary skill in the art would appreciate that this compatibility concept may be applied across other standards. For example, a DDR3-based IHS may utilize DDR2-based riser cards similar to those described herein to create DDR3-DDR2 compatibility, and a hypothetical DDR5-based IHS may utilize DDR4-compatible riser cards to create DDR5-DDR4 compatibility. Accordingly, in other alternative embodiments, the riser card 162 may include DIMM sockets that conform to different standards such as the proposed DDR4 DIMM standards, the DDR2 DIMM standards, or future standards promulgated by JEDEC or another standard setting organization. Further, the riser cards described herein may also be used not for compatibility purposes but simply to increase IHS memory capacity. For instance, in some embodiments the DIMM socket standard on the riser cards may match the native DIMM socket standard in the IHS, which would permit the IHS to utilize a greater number of DIMMS than it has native DIMM sockets.

In the illustrated embodiment, the channel 152 communicatively couples DDR4-based DIMM sockets 174, 176, and 178 to the memory controller 150. The sockets 174, 176, and 178 respectively have riser cards 180, 182, and 184 inserted therein. Like the riser cards 162 and 164, the riser cards 180, 182, and 184 each include a pair of DIMM sockets conforming to the DDR3 standards. However, the riser card 180 is shorter in height than the other riser cards to allow for a riser card to occupy each of the DIMM sockets 174, 176, and 178. Additionally, in some configurations with riser cards occupying three adjacent DIMM sockets, it may be beneficial to utilize Very Low Profile (VLP) DIMMS which have a height of approximately 18 mm as opposed to the more common Low Profile (LP) DIMMs which have a height of approximately 30 mm. The use of VLP DIMMs may improve planar DIMM-DIMM and DIMM-Processor spacing.

As shown in FIG. 2, the channels 153 and 154 respectively communicatively couple DIMM sockets 186, 188, and 190, and DIMM sockets 192, 194, and 196. The DIMM sockets 186, 188, 190, 192, 194, and 196 conform to the proposed DDR4 DIMM standards. In the illustrated configuration, DDR4 SDRAM DIMMs 198 and 200 are respectively inserted into the DIMM sockets 186 and 188, and DDR4 SDRAM DIMMs 202, 204, and 206 are respectively inserted into DIMM sockets 192, 194, and 196. Notably, in the IHS configuration shown, the socket 190 is unoccupied. As is known by those of ordinary skill in the art, DDR channel physics are reaching the point where maximum transfer frequency is dependent upon the number of occupied DIMM sockets per channel. For instance, in the illustrated configuration, the two DIMMs associated with the channel 153 may operate at a different transfer frequency than the three DIMMs associated with the channel 154. In more detail, although a single DDR4 DIMM may have a maximum performance of approximately 2133 million transfers per second (MT/s) in a one-DIMM-per-channel configuration, adding an identical DIMM to the same channel may slow both DIMMs down to approximately 1867 MT/s, and adding a third identical DIMM may slow the three DIMMs down to approximately 1600 MT/s. Thus, in the configuration shown in FIG. 2, the DIMMs associated with channel 153 may operate at approximately 1867 to 2133 MT/s and the DIMMs associated with channel 154 may operate at approximately 1600 to 1867 MT/s. The same principle may hold true when populating DDR4 DIMM sockets with riser cards accepting DDR4 DIMMs: DIMMs on a channel with two out of three DIMM sockets populated with riser cards may have a higher transfer frequency (e.g. 1867-2133 MT/s) than DIMMs on a channel with three out of three DIMM sockets populated with riser cards (e.g. 1867-2133 MT/s). However, in a riser-based configuration as was just described, each channel may be populated with twice as many DDR4 DIMMs than the riser-less configuration of channels 153 and 154, as each riser card may hold two or more DIMMs. Thus, riser cards as described herein may permit an IHS to utilize a greater number of DIMMs before incurring a performance drop.

As described above, the DIMMs associated with the channels 153 and 154 are coupled directly to the native DIMM sockets in the IHS unlike the DIMMs associated with the channels 151 and 152. Accordingly, the illustrated IHS memory configuration includes a combination of riser-based and riser-less DIMMS and also a combination of DDR3 and DDR4 DIMMs. Riser cards such as riser cards 162, 164, 180, 182, and 184 advantageously permit a plurality of mixed configurations such as the illustrated configuration. As such, using the riser cards described herein, an IHS administrator may create a custom system memory configuration that is optimized for performance, cost, power usage, Reliability-Availability-Serviceability (RAS), or other factor or combination of factors. For example, a memory configuration optimized for cost and performance may include two DDR channels populated with two riser-less DDR4 DIMMs each for performance purposes, and also include two DDR channels populated with six riser-based DDR3 DIMMs each for cost purposes (assuming DDR3 DIMM modules are less expensive than DDR4 DIMM modules). Further, in an embodiment with such a configuration, the memory controller or other IHS component may include logic that dynamically stores data in either the DDR3 DIMMs or the DDR4 DIMMs depending on the purpose of the data or the data type.

As shown in FIG. 2, the riser and DIMM arrangement on each of the channels 151, 152, 153, and 154 is intentionally varied to illustrate the configuration flexibility permitted on each independent channel. However, in many embodiments, the riser and DIMM arrangement on each memory channel in an IHS will be identical. It should be understood that all possible arrangements of channels, numbers of DIMM sockets on the motherboard, number of riser cards, and number of DIMMs on the riser card are permitted.

Figure 3:
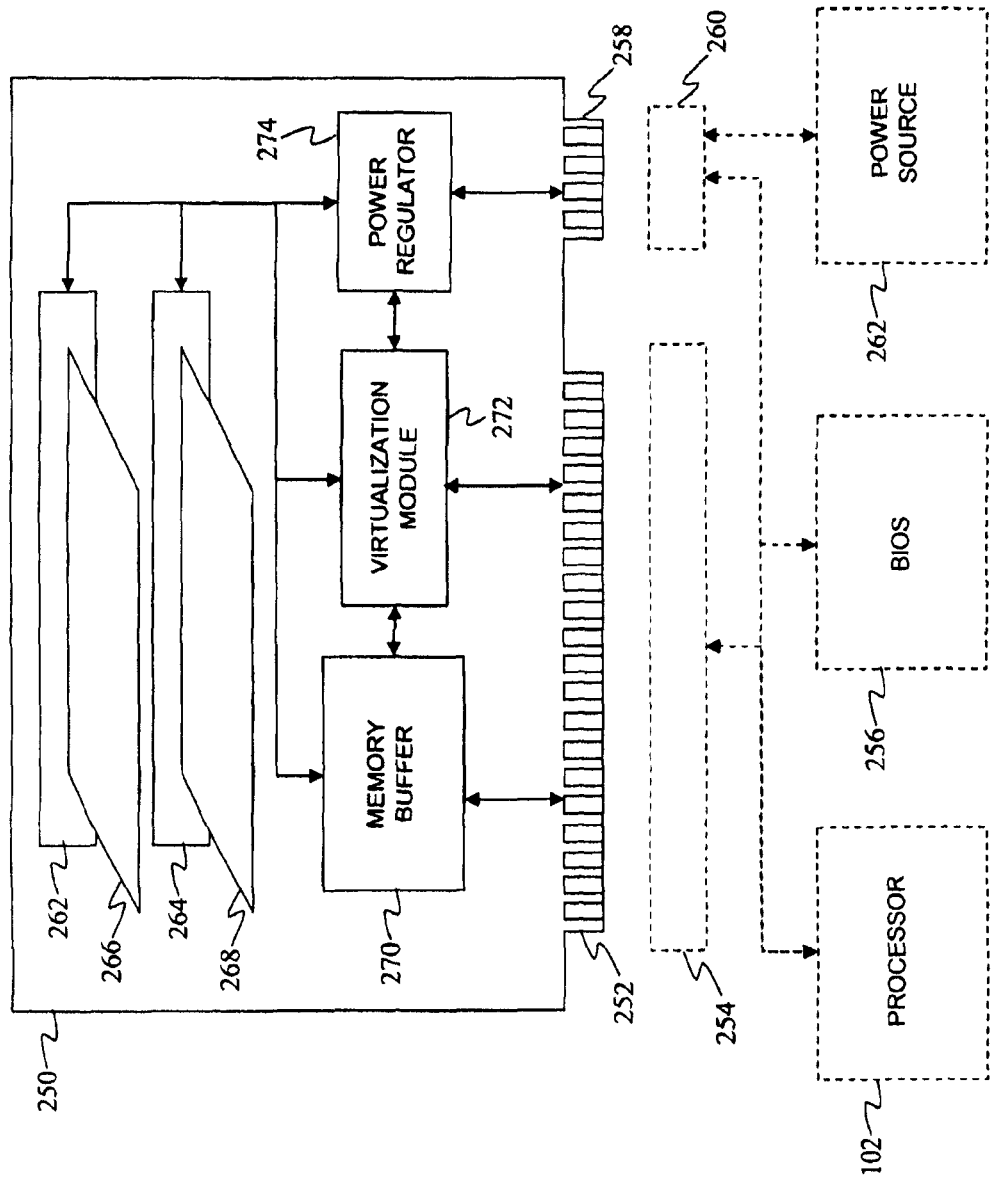
FIG. 3 is a functional block diagram of a memory riser card according to an embodiment of the present disclosure.

FIG. 3 is a functional block diagram of a memory riser card 250 according to an embodiment of the present disclosure. The riser card 250 is similar to the riser cards 162, 164, 180, 182, and 184 of FIG. 2 in that it is configured to permit DDR3 SDRAM DIMMs to be utilized in an IHS with DIMM sockets that conform to the proposed DDR4 standards. In more detail, the riser card 250 includes a card edge connector 252 that physically conforms to the proposed DDR4 standards. Accordingly, the connector includes 284 pins (conductive contacts) and is sized to mate with a DDR4 DIMM socket 254 in an IHS, such as IHS 100. The DIMM socket 254 is communicatively coupled to the processor 102 (which includes the memory controller 150) and BIOS software 256 stored in non-volatile read only memory (ROM) in the IHS. In some embodiments, the DIMM socket 254 and the BIOS 256 may communicate via a communication bus such as a system management bus (SMBus) or other system bus. As will be described later, the BIOS 256 may be responsible for initializing memory devices coupled to the DIMM socket 254. The riser card 250 further includes a secondary card edge connector 258 that is adjacent to the connector 252 but may be smaller and contain fewer pins in some embodiments. The secondary connector 258 is configured to mate with a secondary socket 260 that is adjacent to the DIMM socket 254. The secondary socket 260 is communicatively coupled to the processor 102 and the BIOS 256 via the SMBus or other system bus, and is also coupled to a power source 262 in the host IHS. In the illustrated embodiment, the power source 262 provides the secondary connector 258 with 12 volts, but, in other embodiments, it may provide a larger or smaller supply voltage. Also, in some embodiments, the secondary connector 258 may transfer additional communication signals between the riser card 250 and the IHS such as type of riser, riser power enable, and riser power OK. It should be understood that for the purposes of clarity, the inter-IHS connections between the DIMM connector 252 and the secondary connector 258 and components in the host IHS have been simplified.

The riser card 250 further includes a DIMM socket 262 and a DIMM socket 264 that conform to the DDR3 DIMM standards promulgated by JEDEC. In alternative embodiments, however, the DIMM sockets 262 and 264 may conform to different standards such as the proposed DDR4 DIMM standards or DDR2 DIMM standards. In the illustrated configuration, the DIMM sockets 262 and 264 respectively have a DDR3 SDRAM DIMM 266 and a DDR3 SDRAM DIMM 268 inserted therein. The DIMM sockets 262 and 264 are communicatively coupled to a memory buffer 270, a virtualization module 272, and a power regulator 274. In the illustrated embodiment, the memory buffer 270 and virtualization module 272 are digital logic circuits implemented in hardware, but may alternatively be software modules or a combination of hardware and software in other embodiments. Together, the memory buffer 270, virtualization module 272, and power regulator 274 provide the functionality needed to allow DDR3 DIMMs to be utilized in a DDR4-based IHS. Through this functionality, the riser card may transparently store data sent to the DDR4 DIMM socket 254 in the DDR3 DIMMs 266 and 268. That is, the riser card is configured to communicate with memory controller related functions of BIOS 256 and memory controller 150 in the host IHS in such a manner that is they are not aware that data is stored in two DDR3 DIMMs rather than in a single DDR4 DIMM. In this regard, the total combined data storage capacity of the DDR3 DIMMs 266 and 268 may appear to the memory controller 150 as being contained on a single DDR4 DIMM (i.e. rank multiplication mode). In alternative embodiments, however, each or both of the DDR3 DIMMs 266 and 268 may appear as individual DDR4 DIMMs.

In more detail, the memory buffer 270 on riser card 250 is responsible, among other things, for address and command translation between the memory controller 150 and the DDR3 DIMMS 266 and 268. Because the DIMM socket 254 is DDR4-based, the memory controller 150 will write and access data stored in the DDR3 DIMMs via command and address signals that conform to the proposed DDR4 standards. Specifically, the memory buffer 270 translates DDR4-based command signals from the memory controller 150 into DDR3-based commands and maps incoming DDR4-based address signals into DDR3-based address signals. The memory buffer 270 is further configured to adjust the timing of the incoming DDR4 data and address signals and the timing of the outgoing DDR3 data and address signals. Aside from translation, the memory buffer 270 is also responsible for training/initializing the DDR3 sockets 262 and 264 and associated DIMMs 266 and 268. As will be described later in greater detail, when the memory controller 150 related section of BIOS 256 performs memory initialization, it does so under the assumption that it is initializing DDR4 DIMMs. Thus, the memory buffer 270 must perform the DDR3-specific initialization that the memory controller does not. Additionally, the memory buffer 270 provides rank multiplication or rank-hiding as necessary, phase-lock loop and clock alignment, and DDR4 to DDR3 RAS translation (e.g. CRC termination, SDRAM parity, etc) for the DDR3 DIMMs. Additional detail will be provided in the discussion of Tables 1-3 below.

In the illustrated embodiment, the virtualization module 272 is implemented on a complex programmable logic device (CPLD), but, as mentioned above, may be implemented as a software module or as a combination of both. In general, the virtualization module 272 is responsible for virtualizing the DDR3 DIMMs 266 and 268 into one or more DDR4 DIMMs for the BIOS 256. This involves several tasks. First, the virtualization module 272 is configured to read the serial-presence-detect (SPD) electrically-erasable programmable read-only memory (EEPROM) on each of the DDR3 DIMMs 266 and 268 to extract DIMM type, timing requirements, voltage requirements, DIMM storage capacity, etc. The virtualization module 272 passes this SPD data to the memory buffer 270 so that the memory buffer can initialize the DDR3 DIMMs without the assistance of the memory controller 150. Further, the virtualization module 272 passes the voltage requirements of the DDR3 DIMMs to the voltage regulator 274, so that the voltage regulator may provide each of the DIMMs sockets 262 and 264 with the correct voltage for the DDR3 DIMMs. Second, the virtualization module 272 is configured to handle messages arriving at the DIMM socket 254 over the SMBus from the BIOS 256 or other IHS component. When a SMBus message arrives at the DIMM socket 254 it is intercepted by the virtualization module 272, multiplexed, and appropriately addressed to the DDR3 DIMMs 266 and 268 and/or the memory buffer 270. Third, the virtualization module 272 sends virtualized DIMM information to the BIOS 256 so that the memory controller initialization portion of the BIOS may operate under the impression that the DIMM socket 252 is populated by a single DDR4 DIMM. For example, when the BIOS 256 requests SPD data from the DIMM populating the DIMM socket 252 (via the SMBus or otherwise), the virtualization module 272 responds by sending virtual SPD data indicative of a DDR4 DIMM. The virtualization module 272 may include as a part of the virtual SPD data the total storage capacity of the DDR3 DIMMs 266 and 268. The virtual SPD data sent to the BIOS 256 further includes longer latency values than would be reported for a single DIMM, adjusted timing values, appropriate organization data, and other data necessary to store data in DDR3 DIMMs rather than DDR4 DIMMs. Further, the virtualization module 272 monitors temperature sensors on the DDR3 DIMMs 266 and 268 and the memory buffer 270, and reports the highest temperature value to the BIOS 256, memory controller, or an IHS system management entity. The communication and initialization processes performed by the virtualization module 272 and the BIOS 256 will be described in greater detail in association with FIG. 6.

As the DDR4 DIMM socket 254 is designed to provide power for only a single DDR4 DIMM, the riser card 250 must draw additional power from the IHS to power both DDR3 DIMMs 266 and 268. In the illustrated embodiment, when the secondary connector 258 mates with the connector 260, the power regulator 274 may draw 12 volts from the power source 262 on the IHS. As such, the power regulator 274 is capable of supporting all voltage rails and operating points within the DDR3 and proposed DDR4 specifications (e.g. 1.5 v, 1.35 v, 1.25 v, 1.20 v, 1.1 v, 1.0 v). During memory initialization, as mentioned above, the power regulator 274 dynamically outputs an appropriate voltage level to the DIMMS 266 and 268 based on SPD voltage requirement data read by the virtualization module 272.

Table 1, listed below, gives an example of some of the translation functions performed by the riser card 250 to allow DDR3 DIMMs to be utilized in a DDR4-based IHS. Specifically, in the far left column, Table 1 lists several areas in which translation steps may be performed. Within each area, Table 1 lists several DDR4 functions and their DDR3 equivalents, and then, for each function, an overview of the translation steps performed for that function. In the illustrated embodiment, the memory buffer 270 may perform the translation steps listed in the areas of protocol, architecture, and RAS. The virtualization module 272 may perform the translation steps listed in the areas of SPD and temp sensor, and the power regulator 274 may perform the steps listed in the area of power. In alternative embodiments, however, the riser card 250 may handle different and/or additional memory functions, different modules on the riser card 250 may handle the listed functions, and different and/or additional steps may be carried out to translate each function.

TABLE 1

Riser/Buffer Translation Requirements

| Area | DDR4 Function | DDR3 Function | Translation Mechanism Overview |
| --- | --- | --- | --- |
| Protocol | Data Mask via 10UI Frame | DM via pin | Buffer strips DM from packet; Buffer holds writes in a write buffer; Buffer performs DDR3 writes with DM per byte; |
| Protocol | A17:0 + C2:0/CS3:2 | A15:0 + CS:32/A17:16 | Various methods and mechanisms needed for UDIMMs. For RDIMMs, LRDIMMs, 3DS-TSV DIMMs: Address -> Address; Address -> Address + Chip Selects; Address + Chip ID - > Address + Chip Selects |
| Protocol | ACTIVATE | N/A | Explicit Activate to Implicit Active Commands |
| Protocol | Alert | Error_Out | DDR3 Parity Error to Multi-purpose Alert |
| Protocol | MPR MRS Readout Pages | N/A | Buffer performs equivalent reads via SMBus; Buffer fills new fields not present in DDR3 |
| SPD | 512 Bytes | 256 Bytes | Virtualization module "spoofs" DRAM type; DIMM type; Voltage; Timing Bytes; Configuration; Bank Architecture; RAS modes; etc. Spoofing also covers SPD CRC and Write Protected Areas |

TABLE 1-continued

Riser/Buffer Translation Requirements

| Area | DDR4 Function | DDR3 Function | Translation Mechanism Overview |
|---|---|---|---|
| Architecture | 4x4 Bank Groups (x4/x8 DRAMs) | 8 Banks | Bank virtualization including hidden Activates; Opened/Closed Page Management; Refresh |
| Architecture | Muti-method Refresh; Group Refresh; Partial Array Refresh | Per rank REFRESH | Refresh issuance to multiple banks; dropping extra refreshes; setting controller to 2x refresh and issuing single refreshes; etc. |
| Architecture | 1600-3200 GT/s data rate | 800-2133 GT/s data rate | For common data rates, compensate as necessary with command spacings as required; For read case where DDR4 is faster than DDR3, Buffer holds partial read returns until it can burst to DDR4 side; For write case where DDR4 is faster than DDR3; Buffer holds partial writes until it can burst to DDR3 side Virtualization module adjusts latencies as necessary. |
| RAS | DDR Data CRC via 10UI Frame | N/A | Buffer checks and generates CRC on Host side and provides error status. Protects DDR4 channel on to the Riser module. |
| RAS | Per DRAM Address Parity Detection | N/A | If Buffer is implemented in more than one physical device, supports per device parity error reporting (Spoofing DRAM devices) |
| Power | VDD @ 1.2 v, 1.1 v, 1.0 v | VDD @ 1.5, 1.35 v, 1.25 v | Riser Programmable VRs, Buffer with independently programmable Host Side/ DRAM Side DDR rails |
| Power | Vpp @ 2.5 v external to DRAM | Vpp internal to DRAM | N/A |
| Temp Sensor | On-DIMM in SPD & LR Buffer | On-DIMM in SPD & LR Buffer | Virtualization module reads each DIMM TS (SPD, LRDIMM) and also the BoB TS, and combines into a single TS for memory controller polling. |

It is understood that the riser card 250 may include additional interconnections and modules that are not illustrated in the functional block diagram of FIG. 3. For instance, in some embodiments the riser card 250 may include a fewer or greater number of DIMM sockets and may also include additional logic modules configured to perform additional functions not described herein. Further, the modules described above including the memory buffer 270, the virtualization module 272, and the power regulator 274 may be combined into a single module in some embodiments. Still further, in other embodiments, the riser card 250 may be configured as a mezzanine card in that it includes a planar portion disposed at an approximately right angle to the connector 254. In such a configuration, the DIMM sockets 262 and 264 may be disposed on the planar portions such that DIMMs 266 and 268 extend vertically when inserted.

In the illustrated embodiment described above, the riser card 250 is configured to permit DDR3 SDRAM DIMMs to be utilized in an IHS with DIMM sockets that conform to the proposed DDR4 standards. In alternative embodiments, however, the riser card 250 may be configured to create compatibly between different memory standards. For instance, the riser card 250 may include DIMM sockets conforming to the DDR2 SDRAM standards and may include a connector configured to mate with DDR3-based DIMM sockets in an IHS. Or, the riser card 250 may include DIMM sockets conforming to the proposed DDR4 DIMM standards and may include a connector configured to mate with DIMM sockets conforming to hypothetical DDR5 standards. Further, in other embodiments, the riser card may be configured to create compatibility between proprietary memory modules and an IHS with memory sockets based on a standard, or may be configured to create compatibility between two proprietary memory designs. Still further, and as mentioned above, the riser card 250 may simply be configured to increase the number of DIMM sockets in an IHS, without adding any compatibility functionality. For instance, in a DDR4-based IHS, the DIMM sockets on riser card 250 may also conform to the proposed DDR4 standards. In such a scenario, memory buffer 270 and virtualization module 272 may present the two DDR4 DIMMs on the riser card as one virtualized DDR4 DIMM with double the capacity to the host IHS. U.S. patent application Ser. No. 13/080,720, entitled "MEMORY BUFFER FOR BUFFER-ON-BOARD APPLICATIONS", discloses a memory buffer configured to manage multiple memory modules but represent to a host system that it manages only one large capacity memory module, and is hereby incorporated by reference in its entirety.

Figure 4A:
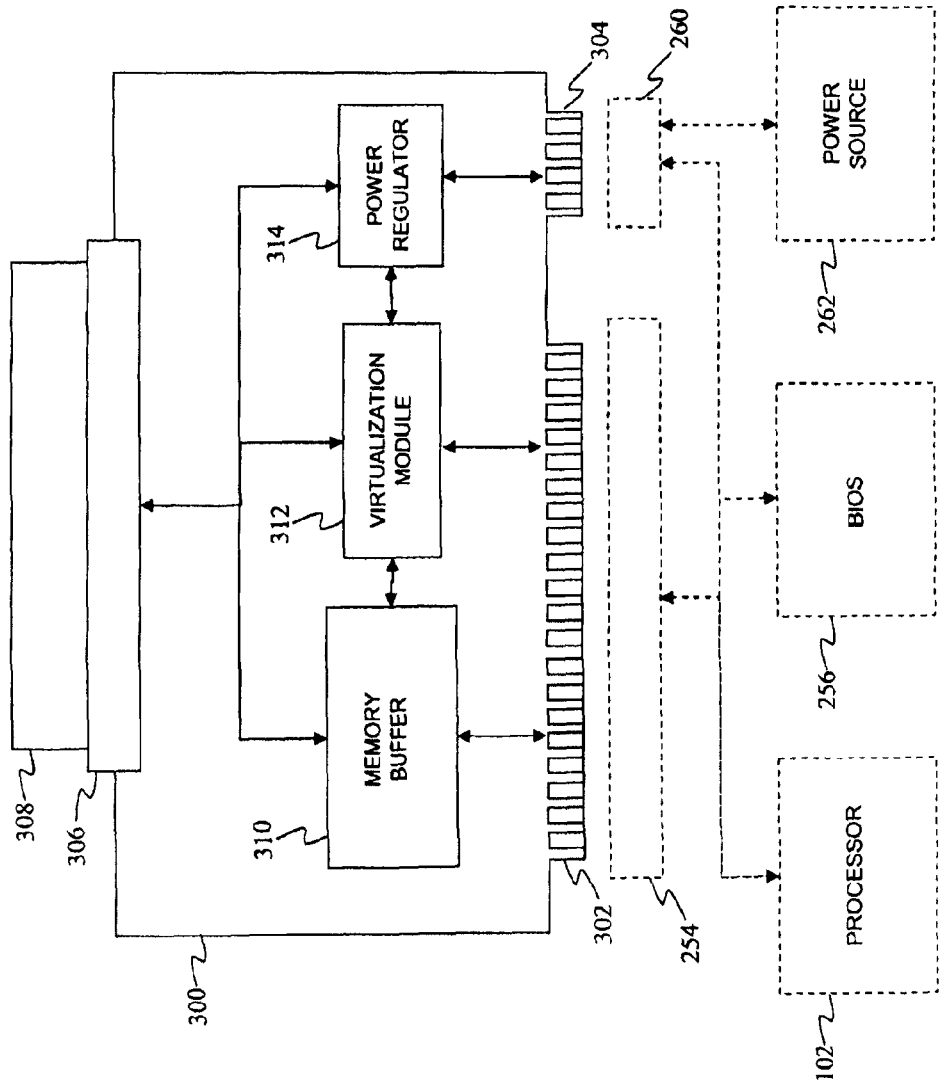
FIG. 4A is a functional block diagram of a DIMM translation card according to an embodiment of the present disclosure.
Figure 4B:
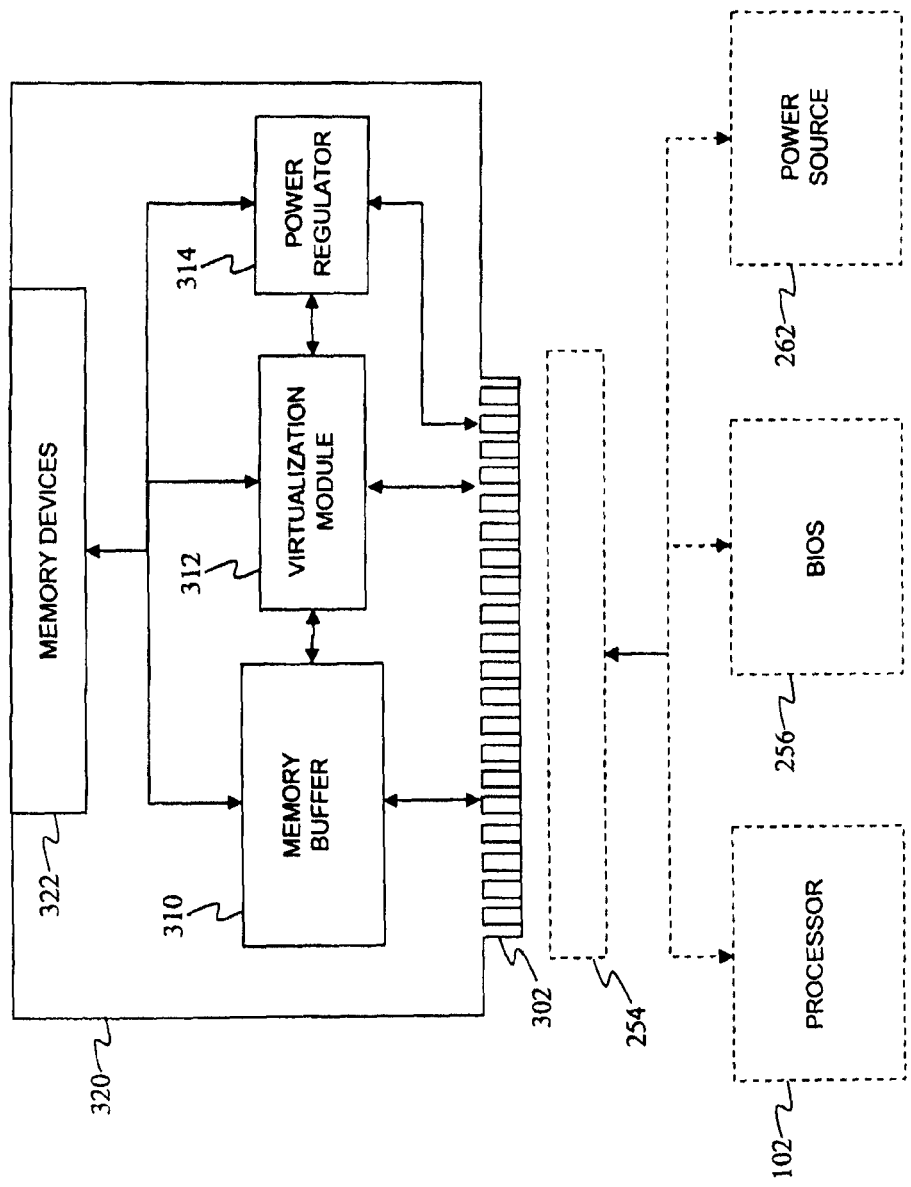
FIG. 4B is a functional block diagram of a DIMM hybrid card according to a further embodiment of the present disclosure.

With reference now to FIG. 4A, illustrated is a functional block diagram of a DIMM translation card 300 according to an embodiment of the present disclosure. The translation card 300 is similar to riser card 250 of FIG. 3 in that it includes a DDR4-based card edge connector 302 configured to mate with the DDR4-based DIMM socket 254 and also a secondary card edge connector 304 configured to mate with the secondary socket 260. Though unlike the riser card 250, the translation card 300 includes a single DDR3 DIMM socket 306 vertically disposed on the top of the card. The DIMM socket 306 accepts a DDR3 SDRAM DIMM 308 therein, and, as shown in FIG. 4A, the DIMM 308 is disposed in a vertical position when inserted. Further, the translation card 300 includes a memory buffer 310, a virtualization module 312, and a power regulator 314 that are configured to perform similar functions to the memory buffer 270, the virtualization module 272, and the power regulator 274 in FIG. 3. In alternative embodiments, the translation card 300 may lack the secondary card edge connector 304 and the power regulator may draw power from the connector 302 (for example, as shown in FIG. 4B). It is understood that in alternative embodiments, the translation card 300 may include additional logic modules and may be configured to create compatibility between any number of memory standards.

With reference now to FIG. 4B, illustrated is a functional block diagram of a DIMM hybrid card 320 according to a further embodiment of the present disclosure. The hybrid card 320 is similar to the translation card 300 but in the hybrid card 320, DDR3 memory devices 322 are incorporated directly into the card, eliminating the need for DDR3 DIMM socket. Further, the hybrid card 320 lacks a secondary card edge connector and thus power regulator 314 regulates power between the standard DDR4 power rail available on connector 302 to the DDR3 device voltage rails of the onboard memory devices 322. In this embodiment, hybrid card 320 essentially is a DIMM with a DDR4 connector and form factor but hosting DDR3 memory devices. As such, the virtualization module 312 is responsible for virtualizing the DDR3 memory devices 322 into one or more DDR4 DIMMs for the BIOS 256.

Figure 5:
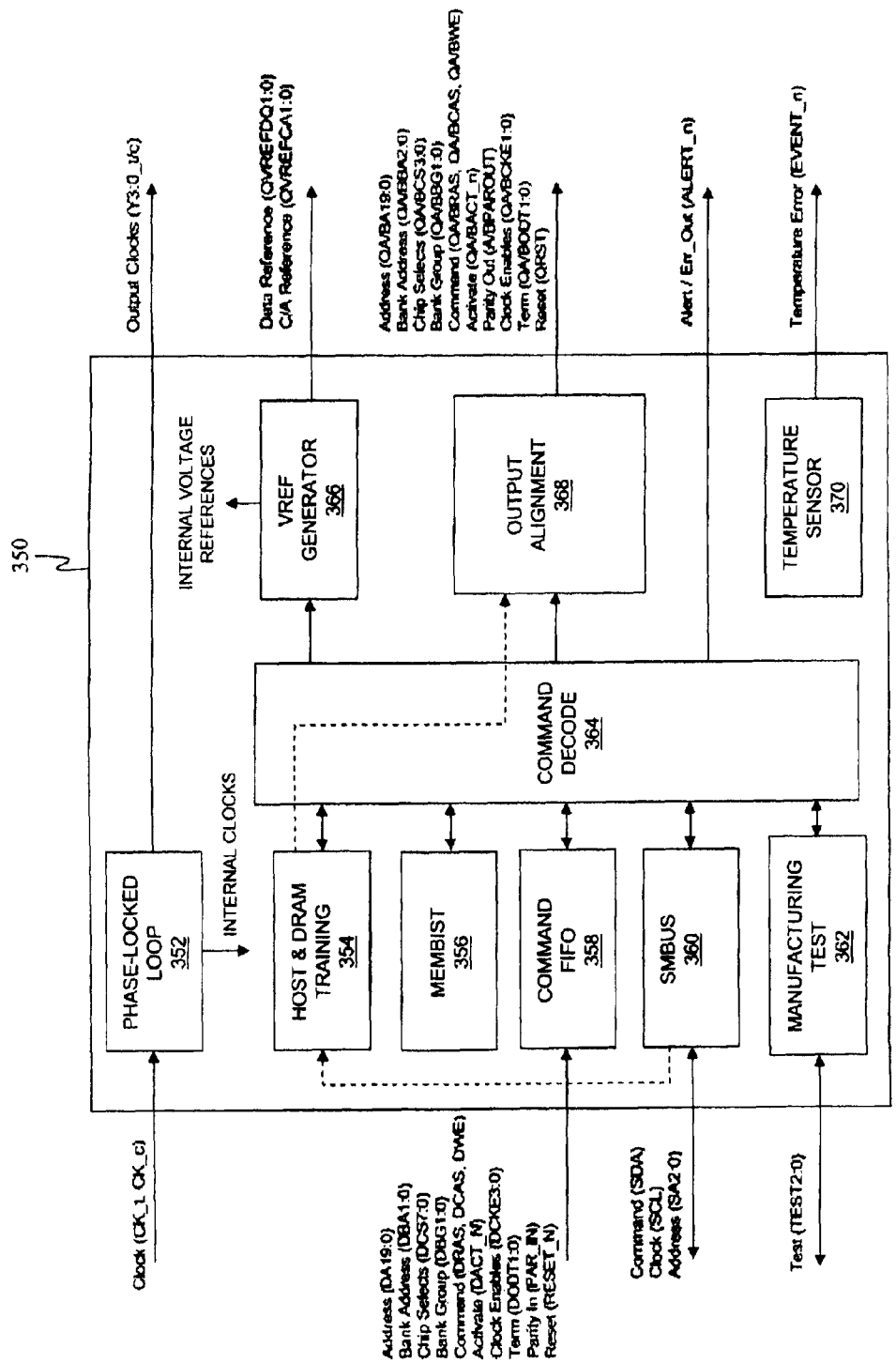
FIG. 5 is a functional block diagram of a command address logic block of the memory buffer of FIG. 3.

With reference now to FIG. 5, illustrated is a functional block diagram of a command address logic block 350 of the memory buffer 270 of FIG. 3. As mentioned above, the memory buffer 270 is disposed on the riser card 250 and is configured to provide a portion of the functionality needed to allow DDR3 DIMMs to be utilized in a DDR4-based IHS. To this end, the command address logic block 350 includes a plurality of logic modules configured to perform a plurality of tasks such as address and command translation between memory standards, timing adjustment of data and address signals, training/initializing DIMMs, rank multiplication or rank-hiding as necessary, phase-lock loop and clock alignment, and DDR4 to DDR3 RAS translation (e.g. CRC termination, SDRAM parity, etc).

In more detail, the command address logic block 350 includes a phase-locked loop module 352, a host and DRAM training module 354, a memory built-in self-test (MemBIST) module 356, a command first-in-first-out (FIFO) module 358, a system management bus (SMBus) module 360, a manufacturing test module 362, a command decode module 364, a voltage-reference (Vref) generator module 366, an output alignment module 368, and a temperature sensor module 370. In the illustrated embodiment, each of these modules 352-370 contain digital circuitries to carry out their intended functionalities, but, in alternative embodiments, the modules may be software modules, or may include a mix of hardware and software. As shown in FIG. 5, a plurality of various digital signals are received by and sent by these modules.

During initialization of the DDR3 DIMMs behind the memory buffer 270, the host and DRAM training module 354 is configured to, among other things, optimize the timing and reference voltage characteristics of the signals sent to the DIMMs. As mentioned above, DDR3 DIMM training must be completed by the memory buffer 270 itself as the memory initialization BIOS 256 of the host IHS believes the DIMM socket 252 is populated by a DDR4 DIMM, and DDR4-based training is different than DDR3-based training. In other words, all memory initialization steps are handled by components on the riser card 250 rather than by the BIOS 256 or memory controller. The training module 354 customizes the DDR3 DIMM training based on the SPD data stored on the DIMMs and collected by the virtualization module 272. Accordingly, during the initial phase of memory initialization the virtualization module 272 transmits the collected SPD data to the SMBus module 360 in the memory buffer 270 which forwards it on to the training module 354. Notably, traditional memory buffers conforming to the JEDEC DDR3 or proposed DDR4 standards lack SMBus interfaces capable of acquiring DRAM parameters (SPD data).

After initialization and during normal IHS operation, the command decode module 364 is responsible for address and command signal translation. That is, the command decode module 364 receives address and command signals conforming to the proposed DDR4 standards from the memory controller 150 and translates them into DDR3-based signals before forwarding them on to the DDR3 DIMMs. As an aspect of this, in the embodiments in which two DIMMs onboard the riser card are virtualized into a single DIMM with twice the capacity, the command decode module 264 performs the address signal manipulation necessary for rank multiplication. After the command decode module 264 had translated the command and address signals, it passes them on with the data to the output alignment module 368, which adjusts the timing and alignment of the data before it is stored in the DDR3 DIMMS. The output alignment module 368 performs the alignments based on timing and other data received from the host and training module 354, which, as previously mentioned, was influenced by the SPD data stored on the DDR3 DIMMs.

Table 2, listed below, is an example of the DDR4 to DDR3 address translation performed by the command decode module 364. For different DIMM configurations (e.g. 4 Gbx4, 4 Gbx8, etc), Table 2 depicts several address formats for a DDR3 module and then the corresponding address formats for a DDR4 module. In some embodiments, the command decode module 364 may include a table such as Table 2 to assist in address signal translation. It is understood that the specific values in Table 2 are just examples and that other values may be applicable to address translation. These other values still fall within scope of present invention.

TABLE 2

|  | DDR3 4Gbx4 | DDR4 4Gbx4 | DDR3 4Gbx8 | DDR4 4Gbx8 | DDR3 8Gbx4 | DDR4 8Gbx4 | DDR3 8Gbx8 | DDR4 8Gbx8 |
|---|---|---|---|---|---|---|---|---|
|  |  | BG(0, 1) |  | BG(0, 1) |  | BG(0, 1) |  | BG(0, 1) |
| BA | BA(0-2) | BA(0, 1) | BA(0-2) | BA(0, 1) | BA(0-2) | BA(0, 1) | BA(0-2) | BA(0, 1) |
| AP | A10 |  | A10 |  | A10 |  | A10 |  |
| BC | A12 |  | A12 |  | A12 |  | A12 |  |
| RA | A(0-15) | A(0-15) | A(0-15) | A(0-14) | A(0-15) | A(0-16) | A(0-15) | A(0-15) |
| CA | A(0-9), A11 | A(0-9) | A(0-9) | A(0-9) | A(0-9), A11, A13 | A(0-9) | A(0-9), A11 | A(0-9) |
| P SIZE | 1K | 512K | 1K | 1K | 2K | 512K | 2K | 1K |

Further, Table 3, listed below, is an example of the command signal translation performed by the command decode module 364. Specifically, Table 3 lists several DDR4 signals and their DDR3 equivalents. In some embodiments, the command decode module 364 may include a table such as Table 3 to assist in command signal translation. It is understood that the specific values in Table 3 are just examples and that other values may be applicable to command signal translation. These other values still fall within scope of present invention.

TABLE 3

| | | | | | | | | | |
|---|---|---|---|---|---|---|---|---|---|
| DDR4 | CKE1:0 | CS1:0 | C2:0 | | ACT | A17 | RAS/A16 | CAS/A15 | WE/A14 | A13 |
| DDR3 | CKE1:0 | CS1:0 | CS2, CS3, N/A | N/A | A15 | RAS | CAS | WE | A13 |

| | | | | | | | | |
|---|---|---|---|---|---|---|---|---|
| DDR4 | A12/BC | A11 | A10/AP | A9:0 | BG1 | BG0 | BA1:0 | EVENT | ALERT |
| DDR3 | A12/BC | A11 | A10/AP | A9:0 | BA2 | A14 | BA1:0 | ERR_OUT | ALERT |

As mentioned above in association with Table 1, the memory buffer 270 also performs error checking translation from the scheme specified in the proposed DDR4 standards to the scheme specified by the DDR3 standards and vice versa. The command decode module 364 handles these translation aspects. Specifically, the command decode module 364 translates Reliability-Availability-Serviceability (RAS) functionality such as CRC checking and parity detection. Note that although not shown and not logically residing within command address logic block 350, a CRC generation/check block is also needed. The CRC generation/check block may be disposed in the DDR channel data path of memory buffer 270, but control and status is coupled to the command decode block 364 and other sub-elements of command address logic block 350 as needed to support error handling and logging. It is understood that, in alternative embodiments, the command address logic block 350 may include different and/or additional logic modules, and the illustrated modules may perform different and/or additional functions.

Figure 6:
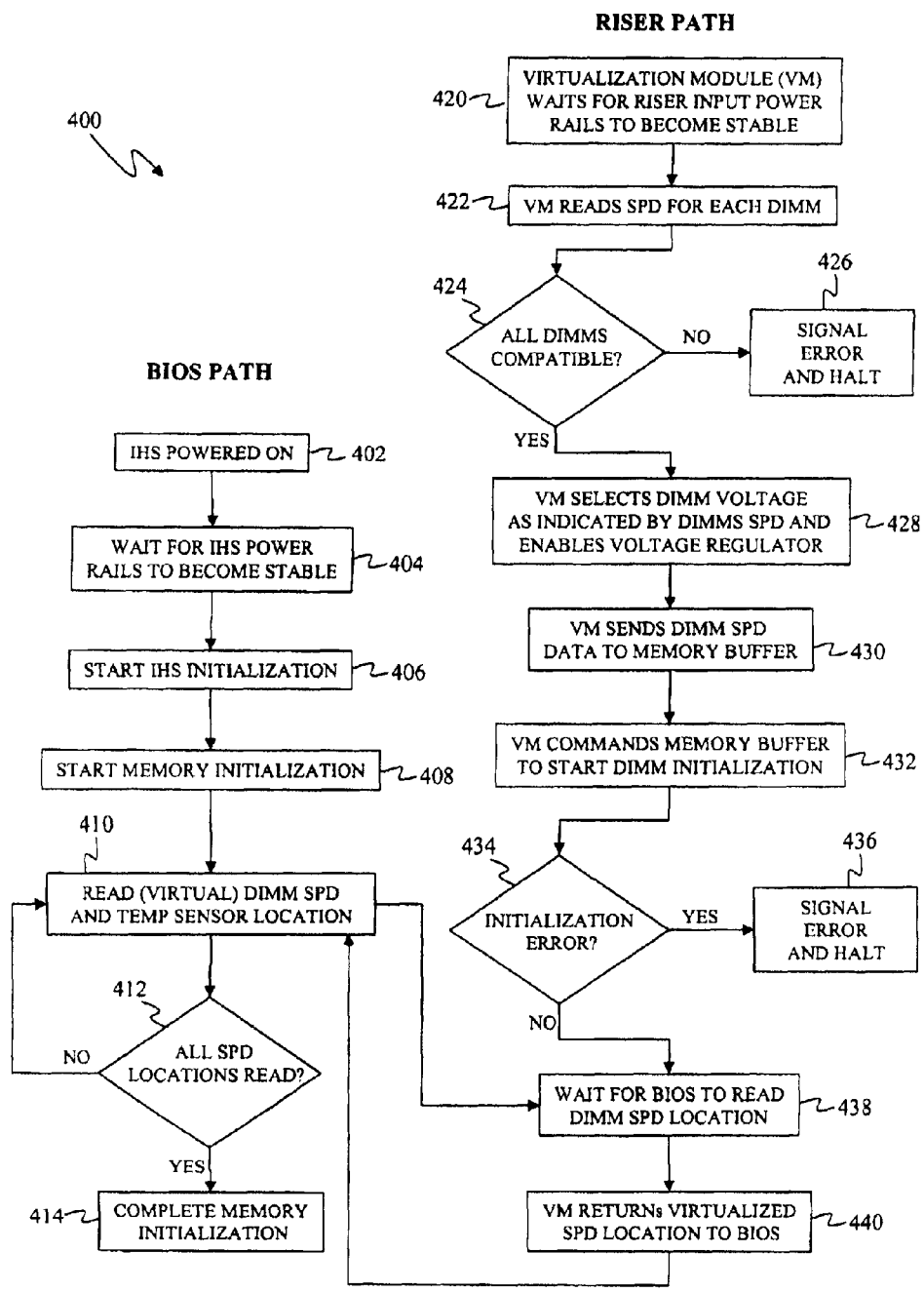
FIG. 6 is a flow chart illustrating a method of initializing the DIMMs on the riser card of FIG. 3 according to an embodiment of the present invention.

FIG. 6 is a flow chart illustrating a method 400 of initializing the DDR3 SDRAM DIMMs on the riser card 250 in FIG. 3 according to an embodiment of the present invention. Specifically, the method 400 includes two paths, a BIOS path illustrating actions performed by the BIOS 256 during IHS initialization and a riser path illustrating actions performed by the riser card 250 during IHS initialization. The method 400 begins at block 402 in the BIOS path where the IHS is powered on. Then, the method 400 continues to block 404 where the BIOS waits for the IHS power rails to become stable, after which, the BIOS begins a plurality of IHS initialization processes in block 406. Next, in block 408, the BIOS begins initialization of the system memory 114 (FIGS. 1-2). The method 400 continues to block 410 where the BIOS sends a SMBus message to the DIMM socket in which the riser card 250 is populated. The SMBus message requests SPD data from the DIMM inserted in the DIMM socket. In response, the BIOS receives virtualized SPD data indicative of a DDR4 module with the total capacity of both of the DDR3 DIMMs inserted into the riser card 250. The BIOS also receives a temperature sensor value indicative of the temperature of the hottest of the DDR3 DIMMS and the memory buffer 270. The method 400 proceeds to decision block 412 where it is determined whether all SPD and temperature data have been read from all of the DIMM sockets in the IHS. If not, the method returns to block 410, and if so, the method 400 proceeds to block 414 where the BIOS completes memory initialization.

The method 400 begins down the riser path at block 420 where the virtualization module 272 waits for the power rails electrically coupled to the DIMM socket in which riser card 250 is inserted to become stable. In some embodiments, this block may occur approximately at the same time as block 404 during which the IHS power rails are becoming stable. After the riser card input power rails have become stable, the method 400 proceeds to block 422 where the virtualization module 272 reads the data from the SPD EEPROMs on the DDR3 DIMMs attached to the riser card. Next, in decision block 424, the virtualization module 272 determines if all DIMMs installed in the DIMM sockets on the riser card are compatible with each other and the riser card. If not, the method 400 proceeds to block 426 where the virtualization module sends an error signal the BIOS 256 and halts any further initialization. If all the riser card DIMMs are compatible, the method proceeds to block 428 where the virtualization module 272 selects the voltage as indicated by the DIMMs' SPD data and enables the voltage regulator 274 to output the indicated voltage. Then, in block 430, the virtualization module 272 sends information based on the DIMMs' SPD data to the memory buffer 270, and in block 432 commands the memory buffer to start DIMM initialization based on information extracted from SPD data. Next, in decision block 434, the virtualization module 272 waits for initialization to complete. If initialization fails, the method 400 proceeds to bock 436, where the virtualization module sends an error signal the BIOS 256 and halts any further initialization. If initialization succeeds, the methods continues to block 438 where the virtualization module waits for the BIOS to attempt to read, via the SMBus, the SPD EEPROM of whatever DIMM is inserted into the IHS DIMM socket populated by the riser card. Once the BIOS has made the query, the method proceeds to block 440 where the virtualization module 272 returns virtualized SPD data to the BIOS indicating characteristics of DDR4 DIMM(s) populating the socket in which the riser card is inserted.

In the illustrated embodiment of FIG. 6, the method 400 is directed toward initializing DDR3 DIMMs on the riser card 250 connected to a DDR4-based IHS. In other embodiments, however, a method similar to method 400 may initialize DDR4 DIMMs on a riser card connected to an DDR4-based IHS (i.e. to increase the number of DDR4 sockets on the IHS). For instance, in the DDR4-DDR4 method, the virtualization module may also read the SPD data from the riser-based DIMMs, send the SPD data to the memory buffer for initialization, and upon request, send to the BIOS virtual SPD data indicative of desired DDR4 DIMM characteristics.

It is understood that the actions illustrated in the flow chart of FIG. 6 may, in alternative embodiments, be performed in a different order and may be performed by different modules. Further, the method 400 may include different and/or additional blocks in some embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein

What is claimed is:

1. An apparatus, comprising:
   a first connector configured to fit into a first socket in a processing system, the first connector and first socket conforming to a first standard;
   a second socket configured to accept a memory module therein, the second socket and the memory module conforming to a second standard;

a memory buffer module communicatively coupled to the first connector and the second socket, the memory buffer module configured to receive signals associated with the first standard from the first connector and output signals associated with the second standard to the second socket;

a virtualization module communicatively coupled to the memory buffer module, the first connector, and the second socket, the virtualization module configured to receive first initialization data associated with the second standard from the second socket and output second initialization data associated with the first standard to the processing system; and a power regulation module communicatively coupled to the virtualization module and the second socket, the power regulation module configured to output an amount of power to the second socket based upon the initialization data.

2. The apparatus of claim 1, wherein the virtualization module is further configured to transmit the first initialization data to the memory buffer module; and wherein the memory buffer module is further configured to initialize the memory module inserted into the second socket according to the second standard using the first initialization data.

3. The apparatus of claim 2, wherein the memory buffer module is configured to perform a timing initialization on the memory module inserted into the second socket according to the second standard using the first initialization data.

4. The apparatus of claim 1, wherein the second standard is different than the first standard.

5. The apparatus of claim 4, where in the first standard is the JEDEC DDR4 standard and the second standard is JEDEC DDR3 standard.

6. The apparatus of claim 1, wherein the first initialization data includes serial presence detect (SPD) data associated with the memory module.

7. The apparatus of claim 1, wherein the second initialization data is indicative of initialization data associated with a memory module conforming to the first standard.

8. The apparatus of claim 1, including a second connector configured to fit into a third socket in the processing system and communicatively coupled to the power regulation module; and wherein the power regulation module is further configured to draw the amount of power from the second connector.

9. The apparatus of claim 1, wherein the memory buffer is further configured to map memory module addresses conforming to the first standard to memory addresses conforming to the second standard.

10. An apparatus, comprising:

a first connector configured to fit into a first socket in a processing system, the first connector and first socket conforming to a first standard;

a second socket configured to accept a first memory module therein, the second socket and the first memory module conforming to a second standard promulgated earlier in time than the first standard;

a virtualization module communicatively coupled to the first connector and the second socket, the virtualization module being configured to retrieve serial presence detect (SPD) data from the first memory module via the second socket, the SPD data being associated with the second standard;

a memory buffer module communicatively coupled to the virtualization module, the first connector, and the second socket, the memory buffer module being configured to receive the SPD data from the virtualization module and initialize the first memory module using the SPD data according to the second standard; and a power regulation module communicatively coupled to the virtualization module and the second socket, the power regulation module configured to output an amount of power to the second socket based upon the SPD data.

11. The apparatus of claim 10, wherein the virtualization module is configured to transmit via the first connector virtual SPD data to a basic input/output system (BIOS) on the processing system, the virtual SPD data being indicative of SPD data associated with a virtual memory module conforming to the first standard.

12. The apparatus of claim 10, wherein the memory buffer module is further configured to receive first command signals associated with the first standard from the processing system, translate the first command signals into second command signals associated with the second standard, and transmit the second command signals to the first memory module.

13. The apparatus of claim 10, including a third socket communicatively coupled to the memory buffer module and virtualization module and configured to accept a second memory module therein, the third socket and second memory module conforming to the second standard; and wherein the virtualization module is further configured to transmit virtual SPD data to the processing system, the virtual SPD data including a virtual capacity value approximately equal to a first capacity value of the first memory module plus a second capacity value of the second memory module.

14. A method, comprising:

retrieving, using a virtualization module, first initialization data from a memory module inserted into a first socket, the memory module and first socket conforming to a first standard;

regulating, using a power regulation module communicatively coupled to the virtualization module, an amount of power provided to the first socket, the regulating being based upon the initialization data;

initializing, using a memory buffer module communicatively coupled to the virtualization module, the memory module according to the first standard, the initializing being based upon the initialization data; and transmitting, using the virtualization module, second initialization data based upon the first initialization data and associated with a second standard to a processing system through a first connector inserted into a second socket in the processing system, the first connector and second socket conforming to the second standard.

15. The method of claim 14, including:

receiving, with the memory buffer module, signals associated with the second standard from the processing system through the first connector;

translating, with the memory buffer module, the signals associated with the second standard into signals associated with the first standard; and transmitting, with the memory buffer module, the signals associated with the first standard to the memory module.

16. The method of claim 15, wherein the translating includes mapping memory module addresses conforming to the first standard to memory module addresses conforming to the second standard.

17. The method of claim 14, wherein the second standard is different than the first standard.

18. The method of claim 14, where in the first standard is the JEDEC DDR4 standard and the second standard is JEDEC DDR3 standard.

19. The method of claim 14, wherein the retrieving includes retrieving serial presence detect (SPD) data associated with the memory module.

20. The method of claim 14,
wherein the transmitting the second initialization data includes configuring the second initialization data to be indicative of initialization data associated with a memory module conforming to the first standard; and
wherein the transmitting includes transmitting the second initialization data to a BIOS on the processing system.

* * * * *